United States Patent [19]
Hirota et al.

[11] Patent Number: 5,892,266
[45] Date of Patent: Apr. 6, 1999

[54] LAYOUT STRUCTURE OF CAPACITIVE ELEMENT(S) AND INTERCONNECTIONS IN A SEMICONDUCTOR

[75] Inventors: Yoshihiro Hirota, Kyoto; Toshiyuki Matsumoto, Hyogo; Guoliang Shou; Kazunori Motohashi, both of Tokyo, all of Japan

[73] Assignees: Sumitomo Metal Industries, Ltd., Osaka; Yozan, Inc., Tokyo, both of Japan

[21] Appl. No.: 865,442

[22] Filed: May 30, 1997

[30] Foreign Application Priority Data

May 30, 1996 [JP] Japan .................................. 8-159019

[51] Int. Cl.⁶ .................................................. H01L 29/41
[52] U.S. Cl. ........................ 257/532; 257/535; 257/919
[58] Field of Search ................................... 257/532, 919, 257/535; 438/393

[56] References Cited

U.S. PATENT DOCUMENTS

| 4,654,689 | 3/1987 | Fujii | 257/532 |
|---|---|---|---|
| 4,870,541 | 9/1989 | Cole | 257/532 |
| 4,929,998 | 5/1990 | Boudewijns | 257/532 |
| 5,322,438 | 6/1994 | McNutt | 257/532 |

FOREIGN PATENT DOCUMENTS

| 61-34951 | 2/1986 | Japan . | |
| 1-206642 | 8/1989 | Japan . | |
| 2-213159 | 8/1990 | Japan | 257/532 |
| 4-038862 | 2/1992 | Japan | 257/532 |
| 5-235266 | 9/1993 | Japan | 257/532 |
| 7-83237 | 9/1995 | Japan . | |

OTHER PUBLICATIONS

M.J. McNutt, et al. "Systematic Capacitance Matching Errors and Corrective Layout Procedures", IEEE Journal of Solid–State Circuits, No. 5, May 1994, New York, pp. 611–616.

*Primary Examiner*—David B. Hardy
*Attorney, Agent, or Firm*—Pillsbury Madison & Sutro LLP

[57] ABSTRACT

The present invention reduces parasitic capacitance in a capacitive element distribution system by running unit electrode lead lines and common electrode lead lines in different directions so that the conductor lines may be sufficiently separated to suppress parasitic capacitance.

5 Claims, 2 Drawing Sheets

Accuracy was defined by $$\text{Accuracy (\%)} = \frac{C_1 - C_2}{C_1} \times 100$$

where C1 and C2 are the capacity and they are designed for C1:C2 = 1:1

LAYOUT STRUCTURE OF CAPACITIVE ELEMENT(S) AND INTERCONNECTIONS IN A SEMICONDUCTOR

FIELD OF THE INVENTION

The present invention relates to a layout structure of interconnections and capacitive elements of a semiconductor.

BACKGROUND OF THE INVENTION

As shown in FIG. 6, a typical capacitive element CD in a semiconductor consists of a plurality of unit electrodes (not shown) in capacitive element area CDA and a common electrode (not shown) facing the capacitive element area through an insulation layer (not shown). The unit capacitor electrodes are arranged two-dimensionally to form one, or a plurality of, capacitive element(s) with predetermined capacitance. Each unit electrode is linked to main conductor lines L1 and L2 through lead lines UL1 and UL2 respectively; and the common electrodes are linked to main conductor line L3 through lead lines OL. These conductor lines generally lead in the direction of the capacitive element with spacing between lines minimized to reduce interconnection space and achieve a compact semiconductor.

However, in such an interconnection layout structure, parasitic capacitance is generated between L3 and L1 or L2. This parasitic capacitance reduces the ability to accurately calculate the capacitance of the capacitive element(s) especially when a plurality of capacitive elements are arrayed, as above, because the parasitic capacitance value differs for every capacitive element, in that the parasitic capacitance between L1 and L3 and that between L2 and L3 are not generally equal. Consequently, parasitic capacitance causes output errors.

SUMMARY OF THE INVENTION

The present invention solves the above conventional problems and has an object to provide an interconnection layout structure for reducing the effects of the parasitic capacitance on the capacitive elements.

In a capacitive element layout structure and interconnection layout of a semiconductor according to the present invention, lead lines for unit capacitor electrodes and those for the common electrode are set in different directions. Accordingly, the main conductor lines linked to these lead lines are separated sufficiently to reduce the parasitic capacitance.

PREFERRED EMBODIMENT OF THE PRESENT INVENTION

Figure 1:
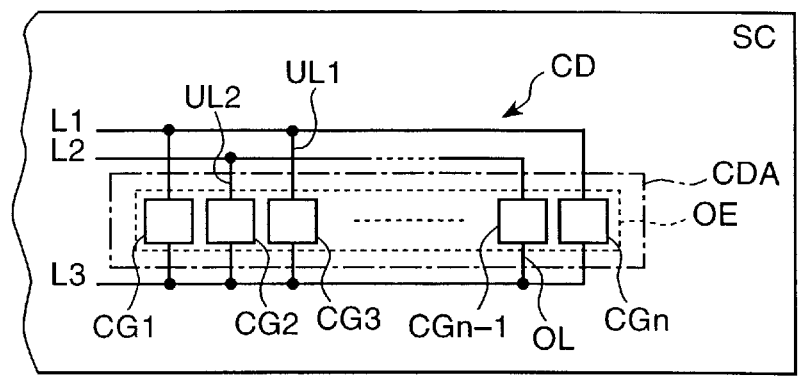
FIG. 1 show plan view of a preferred embodiment of the capacitive element and interconnection layout structure used in the present invention.
Figure 2:
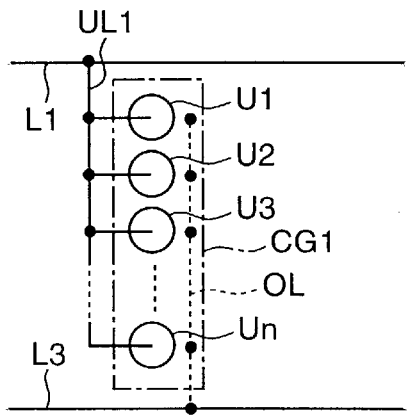
FIG. 2 shows a detailed view of an electrode group shown in FIG. 1.

Hereinafter an embodiment of a capacitive element layout structure and interconnection layout structure of a semiconductor according to the present invention is described with reference to the attached drawings. Referring to FIG. 1, capacitive element CD is structured on a semiconductor SC in capacitive element area CDA by arranging unit capacitor electrode groups CG1 to CGn in parallel. Each electrode group contains a plurality of unit capacitor electrodes U1 to Un, set in straight array as shown in FIG. 2. The unit capacitor electrodes may be formed in regular shapes such as squares, circles, octagons, et al. Each unit capacitor electrode is connected to unit capacitor electrode lead lines UL1 or UL2, which are linked to main conductor lines L1 and L2, respectively. In capacitive element area CDA, a common electrode OE is formed to approximate almost this whole area, and between this common electrode and said unit electrodes, an insulation film (not shown) is formed. Lead lines OL are connected to common electrode OE for a plurality of common electrodes so that OE is connected to L3 through OL.

In FIG. 2, a single electrode group CG1 is shown. Unit electrodes U1 to Un in CG1 are connected to conductor lines L1 and L3 through lead lines UL1 and OL, respectively. Electrode groups CG2 to CGn are structured similar to CG1, so that the even-numbered unit capacitor electrode groups, such as CG2, are connected to conductor lines L2 and L3 through lead lines UL2 and OL, respectively, and the odd-numbered electrode groups are connected to conductor lines L1 and L3 through lead lines UL1 and OL, respectively.

Figure 3:
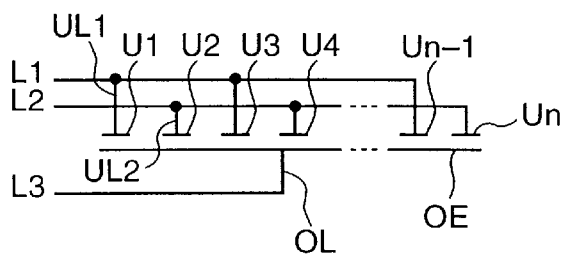
FIG. 3 shows an equivalent circuit of the capacitive element and interconnection layout structure in FIG. 1.

FIG. 3 shows an equivalent circuit of capacitive element CD. As shown, common electrode OE is a common opposite electrode of all the unit capacitor electrodes, connected to L3 by lead line OL. However, in an actual semiconductor, unit electrodes and the common electrode are polysilicon and all have an inner resistance. Setting each capacitance accurately as a counterpart of each unit capacitor electrode, as shown in FIG. 2, means connecting the common electrodes and OL lead line at all positions virtually corresponding to each unit capacitor electrode. As the common electrode OE and the unit capacitor electrodes Un are formed in different layers, OE and OL are shown by broken lines in FIGS. 1 and 2, respectively. Main conductor lines L1 to L3 are formed on a different layer than lead lines UL1, UL2 and OL. Lead lines UL1, UL2 and OL are therefore connected to the layer of L1 to L3 through a hole (not shown).

As is clear from FIG. 3, lead lines UL1, UL2 and OL run parallel to the arrangement of unit capacitor electrodes in each unit capacitor electrode group. Lead line OL runs in the opposite direction of UL1 and UL2. Consequently, L1 and L2 are separated sufficiently from L3 to decrease the generation parasitic capcitance between L1 and L3, and between L2 and L3.

With the structure above, the capacitance value set by capacitive element CD is more accurate than conventional layout structures. Although two capacitance values are shown in the present embodiment, the number is not limited to two.

Figure 4:
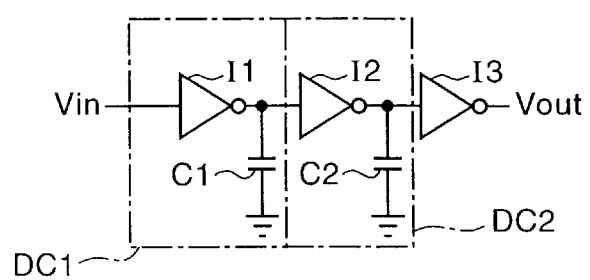
FIG. 4 shows a circuit applying the present embodiment.

FIG. 4 depicts a circuit employing an accurate capacitance layout structure of the present invention. It includes delay circuit DC 1 having capacitor C1 and inverter I1, delay circuit DC2 having capacitor C2 and inverter I2, and inverter I3. In this embodiment, the delay values of DC1 and DC2 are accurately obtained by setting the capacitance values of C1 and C2.

Figure 5A:
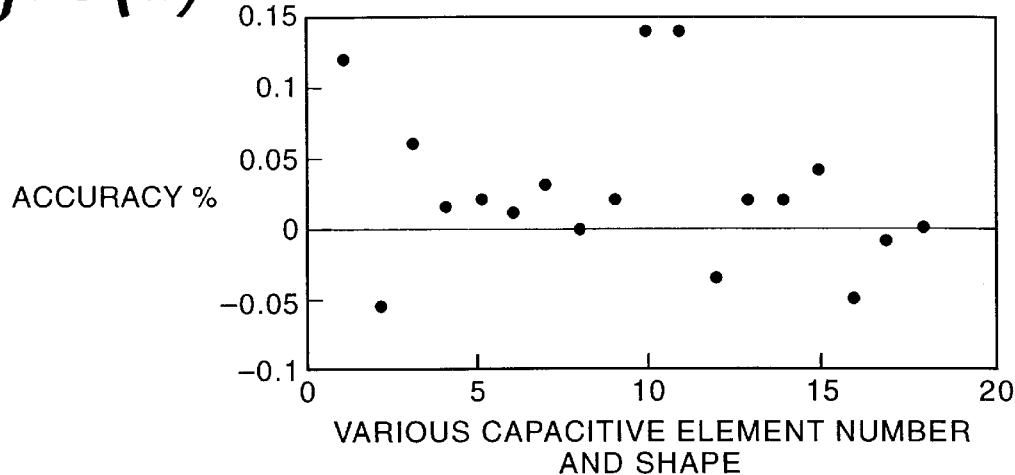
FIGS. 5a and 5b graph comparing the relative accuracy of the capacitive element aninterconnection layout structures of the present invention and a conventional layout structure.
Figure 5B:
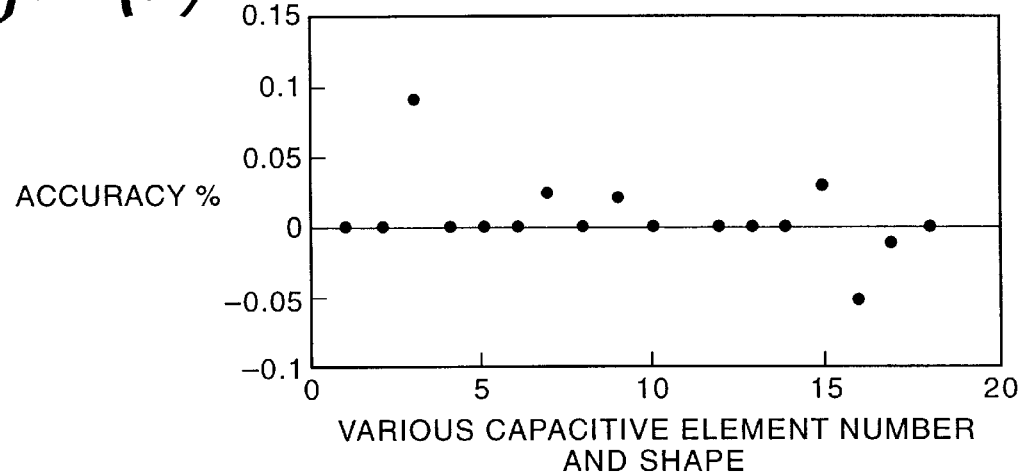
Figure 6:
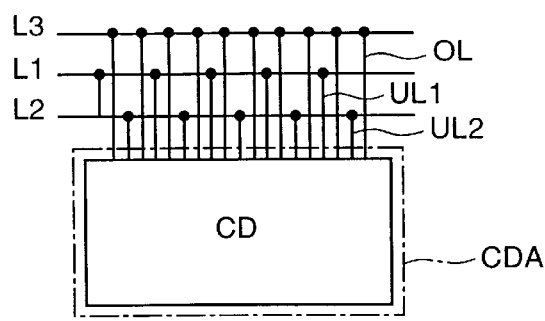
FIG. 6 shows a typical capacitive element in a semiconductor.

FIG. 5 compares the accuracy of various capacitive elements of this invention with conventional ones. Accuracy is shown with respect to 18 kinds of elements each having a different number of capacitive elements, a different shape and a different size. FIG. 5(a) shows the accuracy where lead lines from each capacitive element and the lead lines from the common electrode run in the same direction and lead lines are independently connected to conductor lines via hole. FIG. 5(b) shows the accuracy where conditions are similar to FIG. 5(a), except the two unit capacitor electrode lead lines and the common electrode lead lines run in opposite directions. Table 1 shows capacitive element details.

TABLE 1

| Main interconnection | |
| --- | --- |
| Line Width | 1.2 $\mu$m |
| Space | 1.0 $\mu$m |
| Sub-Interconnection | |
| Line Width | 1.0 $\mu$m |
| Space | 1.0 $\mu$m |
| Conditions of Electrode Formation | |
| Unit Electrode Shape | Circle, Square |
| Unit Electrode Size | Side or diameter 5 $\mu$m, 10 $\mu$m, and 20 $\mu$m |
| Unit Capacitor Number | 16, 32 and 64 |
| Unit Electrode Distribution Space | 5 to 6 $\mu$m |
| Electrode Thickness | 400nm |
| Insulator Thickness | 16nm |
| Electrode Material | P$^+$ doped Polysilicon |
| Via Hole Diameter | 1.2 $\mu$m |

As is clear from FIG. 5, the present invention lowers the parasitic capacitance of the capacitive element improving relative accuracy for semiconductor LSI circuit using capacitor. Although the unit capacitor electrode depicted in FIG. 2 is round, the unit electrodes may be configured in various other shapes.

As mentioned above, in a capacitive element layout structure and interconnection layout structure of a semiconductor according to the present invention, unit capacitor electrode lead lines and common electrode lead lines are set in different directions so that the conductor lines may be separated sufficiently to reduce parasitic capacitance. Therefore, capacitive element accuracy can be improved.

What is claimed is:

1. A capacitive element layout structure of a semiconductor device comprising:
    a first layer having a capacitive element area with a plurality of substantially parallel electrode groups wherein each electrode group includes a plurality of substantially linearly arranged unit electrodes;
    a second layer having a common electrode that covers an area essentially equivalent to said capacitive element area wherein said common electrode is arranged to face all said unit electrodes;
    an insulating layer between said first and said second layers;
    a plurality of first conductor lines on said first layer outside said capacitive element area;
    a second conductor line on said second layer outside said common electrode area;
    a plurality of first lead lines for connecting said unit electrodes of said electrode groups with corresponding ones of said first conductor lines, respectively; and
    a plurality of second lead lines for connecting said common electrode with said second conductor line at positions corresponding to said unit electrodes;
    whereby one or more capacitive elements are formed, and said first and second lead lines run in opposite directions toward said first and second conductor lines, respectively.

2. A capacitive element layout structure of a semiconductor device as claimed in claim 1, wherein said first and second conductor lines run in a direction substantially perpendicular to said parallel electrode groups.

3. A capacitive element layout structure of a semiconductor device as claimed in claim 2, wherein said first and second lead lines are substantially perpendicular to said conductor lines.

4. A capacitive element layout structure of a semiconductor device as claimed in claim 1, wherein said first and second lead lines are substantially parallel to said electrode groups.

5. A capacitive element layout structure of a semiconductor device as claimed in claim 1, wherein one or more of said electrode groups are divided into a plurality of subgroups and said first lead lines are provided for each subgroup.

* * * * *